United States Patent [19]

Yazawa et al.

[11] 4,197,132

[45] Apr. 8, 1980

[54] PHOTOPOLYMER PHOTORESIST COMPOSITION CONTAINING ROSIN TACKIFIER ADHESION IMPROVER AND CHLORINATED POLYOLEFIN

[75] Inventors: Kenichiro Yazawa; Eiichi Hasegawa, both of Asaka, Japan

[73] Assignee: Fuji Photo Film Co., Ltd., Minami-ashigara, Japan

[21] Appl. No.: 847,883

[22] Filed: Nov. 2, 1977

Related U.S. Application Data

[63] Continuation of Ser. No. 699,398, Jun. 24, 1976, abandoned.

[30] Foreign Application Priority Data

Jun. 24, 1975 [JP] Japan .................................. 50-79139

[51] Int. Cl.$^2$ .............................................. G03G 1/68
[52] U.S. Cl. .................................... 430/263; 430/907; 430/913; 430/632; 430/524; 430/306
[58] Field of Search ................ 96/35.1, 115 R, 115 P, 96/86 P; 260/27 R, 27 EV

[56] References Cited

U.S. PATENT DOCUMENTS

| | | | |
|---|---|---|---|
| 2,211,689 | 8/1940 | Dittmar | 260/27 EV |
| 2,485,248 | 10/1949 | Watson | 260/27 EV |
| 2,760,863 | 8/1956 | Plambeck, Jr. | 96/35.1 |
| 3,615,106 | 10/1971 | Flanagan et al. | 260/27 EV |
| 3,650,754 | 3/1972 | Jones | 96/115 X |
| 3,713,831 | 1/1973 | Hayes et al. | 96/115 R |

*Primary Examiner*—John D. Welsh
*Attorney, Agent, or Firm*—Sughrue, Rothwell, Mion, Zinn and Macpeak

[57] ABSTRACT

In a photoresist material comprising a support having formed thereon a layer of a photopolymerizable composition comprising a film forming polymer, a monomer having at least one addition polymerizable unsaturated bond, and a photopolymerization initiator, the adhesive property and the light-sensitivity of the layer of the photopolymerizable composition are improved by incorporating a rosin tackifier in the layer.

13 Claims, No Drawings

PHOTOPOLYMER PHOTORESIST COMPOSITION CONTAINING ROSIN TACKIFIER ADHESION IMPROVER AND CHLORINATED POLYOLEFIN

This is a continuation of application Ser. No. 699,398, filed June 24, 1976, now abandoned.

BACKGROUND OF THE INVENTION

1. Field of the Invention

The present invention relates to an improved photoresist material, and, more particularly, to a photoresist material having an improved layer of a photopolymerizable composition on a support.

2. Description of the Prior Art

Hitherto, solution type photoresist materials such as a photosensitive liquid comprising a combination of a dichromate and glue or a dichromate and polyvinyl alcohol, a photosensitive liquid mainly comprising polyvinyl cinnamate and sensitizers, and a photosensitive liquid mainly comprising a natural rubber or a cyclized rubber and a crosslinking agent have been largely used as photoresist materials for making printed circuits.

Furthermore, as another type of photoresist material, there is a film type photoresist material comprising two plastic films and a photosensitive or photopolymerizable layer sandwiched between the plastic films. Upon use of this type of photoresist material, one of the plastic films is separated to expose the photosensitive layer, the photosensitive layer having another plastic film at the back side thereof is superposed on a copper base plate for making printed circuits, the assembly is image-wise exposed from the plastic film bearing side, the plastic film is then stripped, and the exposed layer is developed in a suitable liquid developer such as an organic solvent or an aqueous alkaline solution. The unexposed portions of the photosensitive layer are dissolved away by the developer while the exposed portions (which were hardened by the action of the actinic radiation) are left on the copper base plate. Thus, a resist pattern for printed circuits is formed on the copper plate.

However, in the above mentioned solution type or film type photoresist materials, there is the troublesome problem that the development requires a liquid developer such as an organic solvent or an aqueous alkaline solution, as well as such a technique is undesirable from the view point of environmental pollution since the use of such a liquid developer may cause pollution problems. Dry developable recording materials have recently been developed in place of such solution development type recording materials, e.g., as are described in Japanese Patent Publication No. 9663/'63 and U.S. Pat. Nos. 3,353,955 and 3,770,438, resist images or patterns are formed by utilizing the difference in adhesive strength to a support between exposed portions and unexposed portions of a layer of photosensitive or photopolymerizable composition. According to this method, the layer of a photopolymerizable composition mainly comprising a polymer binder, an unsaturated monomer, and a photopolymerization initiator is formed on a base support such as a plastic film, a metal plate, a paper, etc., a transparent film is superposed on the layer as a cover, the photosensitive layer is exposed through the cover film and through an original, and then the cover is separated to leave the exposed portions or unexposed portions of the photosensitive layer on the base support while leaving the other portions on the cover film. Thus, a negative and positive (or a positive and negative) of the original image are formed on the base support and the cover film, respectively. In the case of using this type of recording material, developing by a liquid developer as is required in the case of using the aforementioned solution development type recording materials is unnecessary and resist patterns are formed by stripping the cover film. This method is called "stripping development" and the photoresist material used in the method is called a "stripping development type photoresist material". The use of this type of photoresist material in making printed circuits provides large advantages.

Still further, in the case of employing stripping development type photoresist materials, the resist can be quite easily removed as compared with the case of employing the conventional solution development type photoresist materials, and, thus, the stripping development method is said to be a very advanced technique which is easy to use on a commercial scale.

In the case of making resist patterns using stripping development type photoresist materials, it is necessary that the photosensitive layer be broken or split after exposure at the interface between exposed portions and unexposed portions thereof. For this purpose, the properties of the polymer binders and the monomers used in such photoresist materials are particularly important. Among these properties, the properties of the polymer binders, such as, for example, the molecular weight, the softening point, the crystallinity, the miscibility with other elements, and the adhesivity to supports are important points. Furthermore, the images or patterns of the resist thus formed are used for various purposes and hence it is preferred that the resist images or patterns possess properties meeting the end use environment, for example, possess high abrasion resistance, weatherability, etc.

As mentioned above, in a photopolymerizable or photosensitive material comprising a combination of a polymer as a binder, a monomer, and a polymerization initiator, the properties of the elements used in the material are important, but few of the conventional elements used in the photopolymerizable materials have satisfactory properties and they do not give sufficient images or patterns. For example, in the technique disclosed in Japanese Patent Publication No. 9663/'63 polymers are used as a binder and tackifier. As such polymers, polyvinyl butyral, polyvinyl acetate, polyvinyl pyrrolidone, gelatin, an indene-coumarone resin, a silicone resin, rubber, etc., are used. Also, in U.S. Pat. No. 3,770,438 it is described that a vinylidene chloride copolymer, cellulose ether, a synthetic rubber, a polyvinyl acetate copolymer, polyacrylate, polyvinyl chloride, etc., are used as "binder". However, the use of a combination of these polymers, various monomers, and the polymerization initiators for the monomers does not always give sufficient results upon practical use.

As a result of various investigations to overcome these difficulties in conventional techniques, the inventors previously found that chlorinated polyolefins possessed excellent properties as polymers for the binder, and, based on this discovery, made an invention related to a photosensitive material comprising a support having formed thereon a layer of a photopolymerizable composition, and, if necessary, a protective layer formed on the photosensitive layer, the polymerizable composition comprising a chlorinated polyolefin, a monomer having an addition polymerizable unsaturated bond, and a photopolymerizable initiator as described in Japanese Patent Application (Laid Open) No. 123,012/'74 (German Patent Application Offenlegungsschrift No. 2,414,240). However, although the layer of the photopolymerizable composition of the aforesaid invention could provide good resist patterns formed on the surface of a base material by laminating the layer on the surface of the base material, such as a copper plate and an aluminum plate, image-wise exposing the layer, and then stripping the support, it was also found that the exposed or unexposed portions of the layer which had to be left on the base material were partially removed therefrom by the support at stripping to cause cutting or partial defects of the resist patterns on the surface of the base material. This phenomenon is believed to be caused by the fact that the layer of the photopolymerizable composition does not have sufficient and uniformly strong adhesivity to the base material.

SUMMARY OF THE INVENTION

The inventors attempted, considering that rosin and rosin esters have been used as a softening agent and tackifier for rubbers, to mix rosin or rosin esters (hereinafter, they are referred to as rosin tackifiers) and polymers, and found that rosin tackifiers mix well with a wide range of polymers such as chlorinated polyolefins, polymethyl methacrylate, polyvinyl chloride, polyvinyl butyral, polyvinyl acetate, a vinyl chloride-vinyl acetate copolymer, a vinylidene chloride-acrylonitrile copolymer, polyisoprene, chlorinated rubber and poly(chlorosulfonated ethylene), and mixtures thereof, show high adhesion to the surfaces of various materials.

Based on the aforementioned knowledge, the inventors discovered that when a rosin tackifier is further incorporated in a photopolymerizable composition in the aforementioned invention by the inventors, the photoresist layer of the photopolymerizable composition adheres more strongly and uniformly to the base material (e.g., a copper plate, an aluminum plate etc.) after exposure, the resist patterns on the surface of the base material are not accompanied by cutting and the partial occurrence of defects at stripping development, and, further, the light sensitivity of the photopolymerizable composition is higher than that of a photopolymerizable composition containing no rosin tackifier.

Thus, an object of this invention is to provide a stripping development type photoresist material where the hardened portions of the photopolymerizable composition layer adhere strongly and uniformly to the base material after exposure and where there occurs neither cutting nor partial defects of the resist patterns on the surface of the base material at stripping development.

Another object of this invention is to provide a stripping development type photoresist material having high light sensitivity.

Still another object of this invention is to provide a stripping development type photoresist material capable of providing resist patterns having sharp edges.

A further object of this invention is to provide a stripping development type photoresist material where the layer of the photopolymerizable composition adheres uniformly to the surface of a base material before exposure and the unexposed and unhardened portions of the photopolymerizable layer can be completely separated or removed from the base material at stripping development after exposure.

That is, according to this invention, there is provided a photoresist material which is composed of a support, a layer of a photopolymerizable composition comprising at least one film forming polymer, at least one monomer having at least one addition polymerizable unsaturated bond, and a photopolymerization initiator coated on the support, and, if desired or necessary, a protective layer formed on the photopolymerizable composition layer, the photopolymerizable composition further containing a rosin tackifier.

DESCRIPTION OF THE PREFERRED EMBODIMENTS

The main feature of this invention is to employ a rosin tackifier in a photopolymerizable composition. Examples of the rosin tackifier used in this invention are natural rosin (e.g., gum rosin, wood rosin, tall oil rosin, etc.), polymerized rosin, partially hydrogenated rosin, the pentaerythritol ester of partially hydrogenated rosin, glycerol ester rosin, monoethylene glycol ester rosin, methyl abietate, hydrogenated methyl abietate, abietic acid diethylene glycol, 2-hydroabietic acid diethylene glycol, etc. However, on considering the increase in light sensitivity of the photopolymerizable composition, the adhesivity of the resist patterns formed to base materials, the resistivity of the resist patterns to etching solutions, availability, cost, and ease of preparing the photopolymerizable composition, preferred examples of the above illustrated rosin tackifiers are natural rosin (e.g., gum rosin, wood rosin, tall oil rosin, etc.), polymerized rosin, partially hydrogenated rosin, the pentaerythritol ester of partially hydrogenated rosin, glycerol ester rosin, and pentaerythritol ester rosin. Among these, particularly preferred rosin tackifiers are the glycerol ester of partially hydrogenated rosin, the pentaerythritol ester of partially hydrogenated rosin and the pentaerythritol ester of rosin.

It is most preferred, when polymerized rosin is utilized, that the same exhibit a molecular weight of from about 1000 to about 2000. Similarly, when a hydrogenated rosin is used, from about 50 to 100% of the double bonds are hydrogenated, which also applies to the case of utilizing hydrogenated methyl abietate.

The aforementioned rosin tackifiers may be used individually or as a combination of two or more rosin tackifiers. The amount of the rosin tackifier used is in a range of about 0.1% by weight to about 30% by weight of the total solids content of the photopolymerizable composition, preferably in the range of 1 to 10% by weight.

If the content of the rosin tackifier is less than the above described range the polymerizable composition loses the property that the layer thereof adheres uniformly and strongly to the surface of a base material, the resist patterns on the surface of a base material are liable to be accompanied by the formation of cutting and partial defects at stripping development after image-wise exposure, and, further, the light sensitivity of the polymerizable composition is not increased. On the other hand, if the content of the rosin tackifier is over the aforesaid range, the preparation and coating of the photopolymerizable composition become difficult, the effect of increasing the light sensitivity is lost, solidification of the resist patterns finally formed on the surface of the base material insufficiently occurs to result in tackiness for a long length of time, and thus the strength of the resist patterns is reduced.

As the film forming polymers used in this invention, there can be illustrated a chlorinated polyolefin (e.g., chlorinated polyethylene, chlorinated polypropylene, etc.), polymethyl methacrylate, polymethyl acrylate, polyvinyl chloride, polyvinylidone chloride, polyvinyl butyral, polyvinyl acetate, a vinyl chloride-vinyl acetate copolymer, a vinylidene chloride-acrylonitrile copolymer, polyisoprene, a chlorinated rubber, polychloroprene, polychlorosulfonated ethylene, and polychlorosulfonated propylene. Among these polymers, preferred examples of the film forming polymer used in this invention are chlorinated polyethylene, chlorinated polypropylene, and polymethyl methacrylate.

Preferred film forming polymers utilized in the present invention include chlorinated polyolefins such as chlorinated polyethylene and chlorinated polypropylene having a molecular weight of from about 8,000 to about 50,000 and exhibiting a degree of chlorination of 35 to 75% by weight, more preferably 60 to 73% by weight, and most preferably 65 to 71% by weight.

In this regard, polyvinyl chloride theoretically contains 57% by weight chlorine. In chlorinated polyolefins, chlorine atoms exist along the olefin chain at random, so that the regularity and symmetry of the polyolefin chain is lost, whereby the chain becomes easily dissolvable in organic solvents. Accordingly, even when chlorinated polyolefins contain chlorine in an amount less than that of polyvinyl chloride, a light-sensitive composition comprising the same can uniformly be dissolved in a solvent, providing a suitable homogeneous composition. The upper limit of the chlorine content is 75% by weight since when the chlorine content exceeds this amount hydrogen chloride is easily formed, and the composition becomes somewhat unstable.

Another preferred class of materials includes polymethyl methacrylates having a molecular weight of from about 10,000 to about 50,000.

The monomer having at least one addition polymerizable unsaturated bond used in this invention may be selected from a wide range of addition polymerizable monomers. For example, there are acrylic acid esters, acrylamides, methacrylic acid esters, methacrylamides, allyl compounds, vinyl ethers, vinyl esters, N-vinyl compounds, styrenes, crotonic acid esters, etc. Specific examples of the monomer having one addition polymerizable unsaturated bond include acrylic acid; acrylic acid esters such as alkyl acrylates (though not limitative, most preferably where the alkyl moiety has up to 10 carbon atoms; e.g., propyl acrylate, butyl acrylate, amyl acrylate, ethylhexyl acrylate, and octyl acrylate); methacrylic acid; methacrylic acid esters such as alkyl methacrylates (though not limitative, most preferably where the alkyl moiety has up to 10 carbon atoms; e.g., methyl methacrylate, ethyl methacrylate, propyl methacrylate, isopropyl methacrylate, etc.); acrylamides such as acrylamide and N-alkylamides (though not limitative, most preferably where the alkyl moiety has up to 10 carbon atoms; e.g., examples of the alkyl group are a methyl group, ethyl group, butyl group, isopropyl group, t-butyl group, ethylhexyl group, etc.); methacrylamides such as methacrylamide and N-alkylmethacrylamides (though not limitative, most preferably where the alkyl moiety has up to 10 carbon atoms; examples of the alkyl group are, for example, a methyl group, ethyl group, isopropyl group, t-butyl group, ethylhexyl group, etc.); allyl compounds such as allyl esters (e.g., allyl acetate, allyl caproate, allyl caprylate, allyl laurate, and allyl palmitate); vinyl ethers such as alkylvinyl ethers (though not limitative, most preferably where the alkyl moiety has up to 10 carbon atoms; e.g., hexylvinyl ether, octylvinyl ether, decylvinyl ether, ethylhexylvinyl ether, etc.); vinyl esters, most preferably vinyl esters represented by the formula

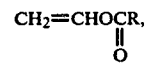

where R is most preferably an alkyl group having up to 10 carbon atoms, though such is not limitative, such as vinyl butyrate, vinyl isobutyrate, vinyl trimethyl acetate, vinyl caproate, vinyl valerate, and vinyl diethyl acetate); styrenes such as styrene and substituted vinyl benzenes, for example, styrene, methyl styrene, chloromethyl styrene, alkoxystyrenes, most preferably alkoxy styrenes represented by the formula

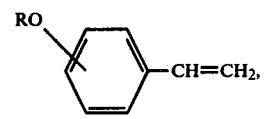

where R is an alkyl group preferably having up to 10 carbon atoms, halogenated styrene, and styrene benzoate; and crotonic acid esters, most preferably crotonic acid esters represented by the formula $H_3CCH=CHCOOR$, where R is most preferably an alkyl group having up to 10 carbon atoms, for example, methyl crotonate, ethyl crotonate, butyl crotonate, hexyl crotonate, and isopropyl crotonate.

Monomers having two or more addition polymerizable unsaturated bonds are more preferably used in this invention than monomers having one addition polymerizable unsaturated bond. Preferred monomers have 6 or less addition polymerizable unsaturated bonds. Examples of monomers having two or more addition polymerizable unsaturated bonds are acrylic acid esters and methacrylic acid esters, most preferably acrylic and methacrylic acid esters having up to 10 carbon atoms, and, as such esters, there are polyacrylates and polymethacrylates of polyhydic alcohols. ("Poly" as is used in this specification means "di" or more, most preferably 6 or less). Specific examples of the polyhydric alcohols are polyethylene glycol, polypropylene oxide, polybutylene oxide, bis($\beta$-hydroxyethoxy)benzene, glycerol, diglycerol, neopentyl glycol, trimethylolpropane, triethylolpropane, pentaerythritol, dipentaerythritol, sorbitan, sorbitol, 1,4-butanediol, 1,2,4-butanetriol, 2-butene-1,4-diol, 2-butyl-2-ethyl-propanediol, 2-butene-1,4-diol, 1,3-propanediol, triethanolamine, decalindiol, 3-chloro-1,2-propanediol, etc.

Preferred examples of the acrylic acid esters and methacrylic acid esters used in this invention are ethylene glycol diacrylate, diethylene glycol dimethacrylate, polyethylene glycol diacrylate, pentaerythritol triacrylate, pentaerythritol dimethacrylate, dipentaerythritol pentacrylate, glycerol acrylate, diglycerol methacrylate, 1,3-propanediol diacrylate and a triacrylic acid ester of ethylene oxide-added trimethylolpropane.

The monomers having at least one addition polymerizable unsaturated bond as illustrated above may be used individually or as a combination of two or more of such compounds. The amount of the monomer is about 10 to about 500 parts by weight, preferably 30 to 200 parts by weight, per 100 parts by weight of the film forming polymer.

Any known photopolymerization initiator may be used in this invention. Preferred photopolymerization initiators have an absorption wavelength in the area of from 250 nm to 580 nm and a solubility of 0.1 to 10% in toluene, acetone, methyl ethyl ketone, trichloroethylene, and the like. For example, there are the carbonyl compounds, organic sulfur compounds, peroxides, redox compounds, azo and diazo compounds, halogen compounds, and photo-reductive dyes as described in J. Kosar; "Light-Sensitive Systems", Chapter 5, published by John Wiley & Sons, Inc., New York in 1965.

Typical examples of such carbonyl compounds are benzoin, benzoin methyl ether, benzophenone, anthraquinone, 2-methylanthraquinone, 2-t-butylanthraquinone, 9,10-phenanthrenequinone, diacetylbenzene, and compounds shown by the general formula

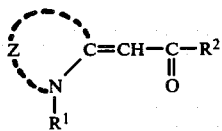

wherein $R^1$ represents an alkyl group as is conventionally present in cyanine dyes, most preferably an alkyl group having up to 10 carbon atoms, such as a methyl group, ethyl group, propyl group, butyl group, isopropyl group, hydroxyalkyl group, alkoxyalkyl group, carboxyalkyl group or a sulfoalkyl group; or an aralkyl group, where most preferably the alkyl moiety has 1 to 5 carbon atoms and the aryl moiety includes phenyl or naphthyl; $R^2$ represents an alkyl group (most preferably an alkyl group having up to 10 carbon atoms, e.g., methyl group, ethyl group, propyl group, butyl group, isopropyl group, etc.), an aryl group (most preferably an aryl group such as phenyl, naphthyl or anthranyl, which may be unsubstituted or substituted with, for example, an alkyl group having 1 to 10 carbon atoms, a hydroxy group, a halogen atom (such as chlorine, bromine, iodine), an alkoxy group having 1 to 10 carbon atoms, etc., e.g., phenyl group, p-hydroxyphenyl group, p-methoxyphenyl group, p-chlorophenyl group, naphthyl group, etc.), or a thienyl group; and Z represents a non-metallic atomic group necessary for forming a nitrogen-containing heterocyclic ring as is conventionally present in cyanine dyes, preferably a 5-membered heterocyclic ring containing at least one nitrogen atom in combination with one or more additional hetero atoms such as nitrogen, sulfur, selenium or oxygen, such as, for example, a benzothiazoline ring, naphthothiazoline ring, benzoselenazoline ring, naphthoselenazoline ring, benzoxazoline ring, and naphthoxazoline ring.

Specific examples of the compounds represented by the above mentioned general formula are 2-benzoylmethylene-3-methyl-$\beta$-naphthothiazoline, 2-benzoylmethylene-3-ethyl-$\beta$-naphthothiazoline, 3-ethyl-2-(2-thenoyl)methylene-$\beta$-naphthothiazoline, 3-ethyl-2-propionylmethylene-$\beta$-naphthothiazoline, 5-chloro-3-ethyl-2-p-methoxybenzoylmethylene benzothiazoline, etc.

Examples of above organic sulfur compounds as can be used in this invention are dibutyl sulfide, dioctyl sulfide, dibenzyl sulfide, diphenyl sulfide, dibenzoyl disulfide, diacetyl disulfide, etc.

Examples of peroxides as can be used in this invention are hydrogen peroxide, di-t-butyl peroxide, benzoyl peroxide, methyl ethyl ketone peroxide, etc.

The redox compound used is a combination of a peroxide and a reducing agent, for example, a combination of ferrous ion and hydrogen peroxide, ferrous ion and persulfate ion, and ferric ion and a peroxide.

Examples of the azo and diazo compounds used in this invention are $\alpha,\alpha'$-azobis-isobutyronitrile, 2-azobis-2-methyl butyronitrile, 1-azo-bis-cyclohexane carbonitrile, and the diazonium salt of p-aminodiphenylamine.

Examples of the halogen compounds used in this invention are chloromethylnaphthyl chloride, phenacyl chloride, chloroacetone, $\beta$-naphthalenesulfonyl chloride, xylenesulfonyl chloride, etc.

Examples of the photo-reductive dyes are Rose Bengale, Erythrosine, Eosine, acriflavine, riboflavin, and thionine.

Among these photopolymerization initiators, preferred are anthraquinone derivatives such as 2-methylanthraquinone, 2-ethylanthraquinone, 2-isopropylanthraquinone and 2-t-butylanthraquinone; benzoin derivatives such as 9,10-phenanthrenequinone, benzoin methyl ether, etc.; and naphthothiazoline derivatives such as 2-benzoylmethylene-3-methyl-$\beta$-naphthothiazoline, 2-benzoylmethylene-3-ethyl-$\beta$-naphthothiazoline, 3-ethyl-2-(2-thenoyl)methylene-$\beta$-naphthothiazoline, and 3-ethyl-2-propionylmethylene-$\beta$-naphthothiazoline.

These photopolymerization initiators may be used individually or as a comination of two or more thereof. The amount of the photopolymerization initiator is about 0.1 to about 20 parts by weight, preferably 1 to 10 parts by weight, per 100 parts by weight of the monomer.

The photopolymerizable composition used in this invention normally comprises the above mentioned components but may further contain a thermal polymerization inhibitor. Specific examples of the thermal polymerization inhibitor are p-methoxyphenol, hydroquinone, alkyl-substituted hydroquinone, most preferably where the alkyl group contains up to 4 carbon atoms, aryl-substituted hydroquinone, most preferably where the aryl group is phenyl or naphthyl, t-butyl catechol, pyrogallol, cuprous chloride, phenothiazine, chloranil, naphthylamine, $\beta$-naphthol, 2,6-di-t-butyl-p-cresol, pyridine, nitrobenzene, dinitrobenzene, p-toluidine, methylene blue, an organic acid copper salt such as copper acetate, copper propionate, etc.

The amount of the thermal polymerization inhibitor used in this case is 0.001 to 5 parts by weight per 100 parts by weight of the monomer used.

The photopolymerizable composition used in this invention may further contain other various additives such as coloring agents, plasticizers, etc.

Examples of the coloring agents are, for example, pigments such as carbon black, iron oxide, phthalocyanine type pigments, azo pigments, etc.; and dyes, such as methylene blue, Crystal Violet, Rhodamine B, Fuchsine, Auramine, azo dyes, anthraquinone dyes, etc. It is preferred that the coloring agent used in this invention not absorb light of a wave length in the absorption wave length region of the photopolymerization initiator used in this invention. The amount of the coloring agent is about 0.1 to about 30 parts by weight, preferably 0.1 to 3 parts by weight, in the case of a pigment, and about 0.01 to about 10 parts by weight, referably 0.1 to 3 parts by weight, in the case of a dye, per 100 parts by weight of the total amount of the film forming polymer and the monomer used. If desired, the photopolymerizable compositions of the present invention may contain an optional plasticizer.

Examples of the plasticizers are phthalic acid esters such as dimethyl phthalate, diethyl phthalate, dibutyl phthalate, diisobutyl phthalate, dioctyl phthalate, etc.; glycol esters such as dimethyl glycol phthalate, ethylphthalylethyl glycolate, methylphthalylethyl glycolate, butylphthalylbutyl glycolate, triethylene glycol dicapric acid ester, etc.; phosphoric acid esters such as tricresyl phosphate, triphenyl phosphate, etc.; triethyl citrate; glycerol triacetyl ester; and butyl laurate. When used, the amount of plasticizer is usually from about 1 to 30 weight % of the composition, more preferably from 5 to 15 weight %.

The photopolymerizable composition of this invention is coated on a proper support as a coating composition thereof in a proper solvent followed by drying. The drying conditions can be widely varied, but usually a temperature of from about 60° to about 130° C. is utilized in combination with times of from 3 minutes to 30 minutes, even more conveniently a temperature of from 80° to 100° C. in combination with times of from 8 to 15 minutes.

Examples of the solvent for the coating composition used in this invention are ketones such as acetone, methyl ethyl ketone, methyl isobutyl ketone, cyclohexanone, diisobutyl ketone, etc.; esters such as ethyl acetate, butyl acetate, amyl acetate, methyl formate, ethyl propionate, dimethyl phthalate, ethyl benzoate, etc.; aromatic hydrocarbons such as toluene, xylene, benzene, ethylbenzene, etc.; halogenated hydrocarbons such as carbon tetrachloride, trichloroethylene, chloroform, 1,1,1-trichloroethane, monochlorobenzene, chloronaphthalene, etc.; ethers such as tetrahydrofuran, diethylether, ethylene glycol monomethyl ether, ethylene glycol monoethyl ether acetate, etc.; dimethylformamide; and dimethyl sulfoxide.

If necessary or desired, a subbing layer or an antihalation layer may be formed on the surface of the support to improve the adhesion between the layer of the photopolymerizable composition and the support.

It is necessary that the support used in this invention have good transparency for light capable of photopolymerizing the photopolymerizable composition of this invention and have an uniform surface. For example, it is necessary that the support used in this invention has a transmittance of at least about 30%, preferably at least 65%, in the wave length region of from 290 nm to 500 nm, and have an uniform surface. Specific examples of supports used in this invention are the films of various plastics such as polyethylene terephthalate, polypropylene, polyethylene, cellulose triacetate, cellulose diacetate, polyvinyl chloride, polyvinyl alcohol, polycarbonate, polystyrene, cellophane, a polyvinylidene chloride copolymer, a polyamide (e.g., nylon-6, nylon-6,6, nylon-6,10 etc.), polyimides, a vinyl chloride-vinyl acetate copolymer, polytetrafluoroethylene, polytrifluoroethylene, etc. Furthermore, a composite film composed of two or more polymer films may also be used in this invention.

The support used in this invention generally has a thickness of about 10 to about 150 μm, preferably 20 to 50 μm, but other thicknesses can also be employed in this invention.

The thickness of the layer of the photopolymerizable composition formed on the support is such that the resist patterns finally formed on the support can meet the desired functions thereof, and, in general, the thickness is in the range of about 5 to about 100 μm, preferably 10 to 60 μm, in dry thickness, that is, the layer containing no solvent.

The recording material or photoresist material of this invention is composed of a support and the layer of the photopolymerization composition formed on the support, and, if necessary or desired, a protective film may be formed on the layer of the photopolymerizable composition. Examples of the materials used for the protective film are the plastics described relative to the support materials as well as papers and papers laminated with polyethylene, polypropylene, etc. The thickness of the protective film is generally about 8 to about 80 μm, preferably 10 to 50 μm. In this case, it is necessary that the adhesive strength between the layer of the photopolymerizable composition and the support be higher than the adhesive strength between the layer of the photopolymerizable composition and the protective film. For example, combinations of supports and protective films as shown in Table 1 are preferably used in this invention.

Table 1

|     | Support | Protective film |
| --- | --- | --- |
| (1) | Polyethylene terephthalate | Polypropylene |
| (2) | Polyethylene terephthalate | Polyethylene |
| (3) | Polyamide (e.g., nylon-6) | Polyethylene |
| (4) | Polyvinyl chloride | Cellophane |
| (5) | Polyimide | Polypropylene |

In the resist material of this invention, the support and the protective film may be selected as illustrated in the above Table or at least one of the support and the protective film may be subjected to a surface treatment so that both elements satisfy the aforementioned relationship of the adhesive strengths. The surface treatment of the support is usually to increase the adhesive strength of the support and the layer of the photopolymerizable composition, and, as such a surface treatment, there is the formation of a subbing layer, a corona discharge treatment, a flame treatment, an ultraviolet irradiation, a high frequency wave treatment, a glow discharge treatment, an active plasma treatment, a laser irradiation treatment, etc.

Furthermore, surface treatment of the protective film is practiced to reduce the adhesive strength of the film to the layer of the photopolymerizable composition, and, as such a surface treatment, there is forming a subbing layer of a poly-organosiloxane, a fluorinated polyolefin, polyfluoroethylene, etc.

The formation of images of patterns using the photoresist material of this invention will now be explained in detail.

When the photoresist material of this invention has a protective film, the protective film is separated and the layer of the photopolymerizable composition of the photoresist material is laminated on a desired base material and then the photopolymerizable layer is imagewise exposed through the transparent support. In this case, a light source in the 350 to 450 nm wave length region, such as a high pressure mercury lamp, a xenon lamp, a carbon arc lamp, and a fluorescent lamp for duplication may be employed. Other sources such as a laser, electron beams, and X-ray sources may be also employed. When the support is separated after imagewise exposure, the exposed portions of the layer are hardened and left on the base material while the unexposed portions of the layer are removed (unhardened) together with the support. Thus, resist images or patterns are formed on the surface of the base material.

The photoresist material of this invention provides resist patterns having very sharp edges as compared with the resist patterns formed from conventional solution type photoresist materials and also can form fine patterns. Furthermore, the photoresist material of this invention has a higher light sensitivity than conventional photoresist materials having a layer of a photopolymerizable composition containing no rosin tackifier, and the adhesive strength of the layer of the photopolymerizable composition of this invention to a base material after exposure is increased and cutting and partial defects of the resist patterns obtained do not occur at stripping development. It has further been found that the resist patterns formed from the photoresist material of this invention have excellent properties as resists for making printed circuit base plates, for example, following the procedures given in U.S. Pat. Nos. 3,353,955 and 3,770,438. Moreover, it has been found that the resist patterns formed from the photoresist material of this invention are superior in abrasion resistance and chemical resistance to those of the prior art.

The invention will now be illustrated more specifically by the following examples, but the invention is not to be construed as limited to these examples. In the following, all percentages are weight percentages, unless otherwise indicated.

EXAMPLE 1

| | |
|---|---|
| Chlorinated polyethylene (Superchlon CPE-907 LTA made by Sanyo Kokusaku Pulp K.K.)* | 10 g |
| Pantaerythritol methacrylate | 10 g |
| 2-Methylanthraquinone | 0.2 g |
| Hydroquinone | 0.1 g |
| Copper phthalocyanine pigment | 0.2 g |
| Partially hydrogenated rosin glycerol ester (Ester Gum-H, made by Arakawa Rinsan Kagaku Kogyo K.K.; the ester of glycerol and abietic acid where approximately 70% of the double bonds thereof are hydrogenated) | 0.4 g |

(*):Chlorinated polyethylene having a viscosity of about 90 c.p.s. in a toluene solution of 40% by weight of it at 25° C. and having a chlorine content of 69% by weight.

A solution of a photopolymerizable composition was prepared by dissolving the mixture of the above composition in a mixed solvent of 100 ml of methyl ethyl ketone and 20 ml of dimethylformamide. A part of the solution was coated on a polyethylene terephthalate film 25 μm thick and dried for 20 minutes at 80° C. The dry thickness of the layer of the photopolymerizable composition was 15 μm. The layer of the photopolymerizable composition was superposed under pressure (about 1 kg/10 cm) on the surface of a copper base plate for a printed circuit (a laminate of an epoxy resin plate reinforced by glass fibers and having a thickness of 1.2 mm and a copper foil of 35 μm thick, the base plate having an area of 10 cm×15 cm). A negative transparency having a printed circuit pattern was intimately contacted with the surface of the photoresist material and the assembly exposed through the negative transparency to a two kilowatt mercury lamp at a distance of 50 cm for 1 minute. Then, by immediately stripping the polyethylene terephthalate film support, the exposed and hardened portions of the layer of the photopolymerizable composition corresponding to the negative transparency were left on the copper layer of the copper base plate to provide a positive image of the original and the unexposed and unhardened portions of the layer of the photopolymerizable composition corresponding to the negative original were removed together with the polyethylene terephthalate film. The resist patterns formed on the copper base plate had no faults such as cutting, defects, etc., for example, cutting implies a complete break in the image and defect implies a partial removing of the image layer leading to a surface inhomogeneity. By repeating the same procedure as above using nine copper base plates having the same size as above, resist patterns having no defects were similarly obtained.

Thereafter, each of the copper base plates having resist patterns thus formed were subjected to etching of the copper layer in an aqueous solution of 38% by weight iron (III) chloride at 40° C. for about 5 minutes. During the processing, the layer of the photopolymerizable composition maintained strong adherence to the surface of the copper layer and there occurred no stripping of the layer and no formation of pin holes. The layer of the photopolymerizable composition was easily removed from the copper plate (after etching) in methylene chloride at 20° C. for 2 minutes. On the other hand, when a conventional phoresist film (e.g., Rison made by E. I. Du Pont De Nemours & Co.) was used, it was not so easy to remove the final resist from the copper layer, and, thus, the photoresist material of this invention was superior at this point also.

REFERENCE EXAMPLE 1

A mixture having the same composition as in Example 1 except that the glycerin ester of partially hydrolyzed rosin was not used was coated and dried as in Example 1 to form the layer of the photopolymerizable composition. The thickness of the layer of the photopolymerizable composition was about 15 μm. Furthermore, in the same manner as in Example 1, a resist pattern was formed on a copper base plate. By following the same procedure as in Example A, resist patterns were formed on ten copper base plates. Upon evaluating the resist patterns thus formed, it was confirmed that there occurred one defect (mainly cutting of the circuit formed) per two copper plates, on the average. However, the number of defects did not further increase when the copper plates having the resist patterns were etched in an aqueous solution of 38% by weight iron (III) chloride at 40° C.

EXAMPLE 2

A photopolymerizable composition as in Example 1 was formed except that the pentaerythritol ester of rosin (Pencel-A, made by Arakawa Rinsan Kagaku Kogyo K.K. This material has an acid value of 19, a softening point of 102° C., a Gardner viscosity of A1 in a 60 wt.% toluene solution and is soluble in benzene, ethyl acetate, spirit turpentine, acetone, petroleum benzoin and drying oil, but insoluble in alcohols) was used in place of the glycerol ester of partially hydrogenated rosin and the composition was coated on a polyethylene terephthalate film 25 μm thick, dried for 20 minutes at 80° C., and superposed under pressure on the copper layer surface of a clean flexible copper laminate (a flexible laminate plate of a polyimide resin plate (100 μm)

and a copper foil (35 μm thick) and having an area of 20 cm × 20 cm). Then, the photopolymerizable composition layer thus formed was exposed as in Example 1 (except that the exposure time was changed to 40 seconds) and the support of the photoresist material was stripped to form positive resist patterns of the negative transparency on the copper layer of the flexible copper laminate plate. Fine resist line patterns (100 μm) were sharply formed and the resists sufficiently endured an etching treatment (treatment in an aqueous solution of 38% by weight iron (III) chloride at 40° C. for about 5 minutes).

In the same manner as above, similar resist patterns were formed on nine flexible laminate copper plates having the same size as above. By testing the resist patterns formed on the ten laminate copper plates, it was confirmed that five portions of lines were cut per one laminate copper plate, on the average. As is clear from the comparison results shown above, the effect of this invention was better in the case of using the pentaerythritol ester of rosin in the photoresist material.

EXAMPLE 3

A photopolymerization composition having the following composition was prepared.

| | |
|---|---|
| Chlorinated polypropylene (Superchlon CPP-306, made by Sanyo Kokusaku Pulp K.K.)* | 20 g |
| Trimethylolpropane triacrylate | 30 g |
| 2-t-Butylanthraquinone | 0.3 g |
| Methylene Blue | 0.1 g |
| Hydroquinone | 0.1 g |
| Gum rosin(**) | 0.5 g |

(*):Chlorinated polypropylene having a viscosity of about 95 cps in a 40% toluene solution thereof at 25° C. and having a chlorine content of higher than 66% by weight.
(**):As is known, gum rosin is obtained by the steam distillation of oil extracted from pine trees which contains rosin; in this example, the gum rosin had an acid value of slightly in excess of 165 and a softening point slightly in excess of 78° C.

Among the aforesaid components, Methylene Blue was dissolved in 1 ml of ethanol and the other components were dissolved in 50 ml of ethylene chloride. By mixing both solutions, a viscous colored solution of a photopolymerizable composition was prepared. The coating composition thus prepared was uniformly coated on a polyethylene terephthalate film 25 μm thick and dried at 80° C. for 8 minutes in a drying oven to provide a photoresist material having formed thereon a layer of the photopolymerizable composition 10 μm thick.

The photopolymerizable composition layer was then superposed under pressure (about 1 kg/10 cm) on a laminate copper plate having the same construction as in Example 1 at 25° C., and the layer was exposed as in Example 1 except that the layer was exposed to a 2 kilowatt high pressure mercury lamp for 40 seconds at a distance of 40 cm therefrom. The polyethylene terephthalate film was then stripped therefrom to form resist patterns on the copper layer of the laminate copper plate.

The laminate copper plate having the resist patterns thus formed was immersed in an etching solution having the following composition at 45° C. for about 4 minutes.

ETCHING SOLUTION

Solution A: An aqueous solution prepared by dissolving 219 g of ammonium peroxosulfate in 1 liter of water.

Solution B: An aqueous solution prepared by dissolving 146 g of sodium chloride in 1 liter of water.

At use, Solution A was mixed with Solution B at a volume ratio of 1:1.

It was confirmed that, in the etching, the resist patterns thus formed were not changed and kept good etching resistance, and, also, the printed circuit of the copper layer thus obtained was accompanied by the formation of quite less side etching. On the other hand, when a photoresist material was prepared using the photopolymerizable composition the same as the above except that only gum rosin was omitted from the composition and a printed circuit of a copper layer was prepared in the same manner as above using the photoresist material thus prepared, there was cutting of the line resist patterns and the printed circuit thus formed was accompanied by side etching. From the comparison results, it was confirmed that the resist patterns formed from the layer of the photopolymerizable composition of the photoresist material of this invention had excellent adhesion to the copper base plate.

EXAMPLE 4

A layer of a photopolymerizable composition prepared in the same manner as in Example 1 was coated on a polyethylene terephthalate film 25 μm thick, the dry thickness of the layer being 30 μm. It was superposed on a copper base plate for making printed circuits. The photopolymerizable layer thus formed was exposed through a positive transparency to a 2 kilowatt high pressure mercury lamp for 40 seconds at a distance of 40 cm therefrom, and then the polyethylene terephthalate film was immediately stripped therefrom to form a negative photo-cured resist pattern on the copper base plate. On comparing the resist patterns thus formed with the resist patterns formed from the photopolymerizable composition containing the glycerol ester of partially hydrogenated rosin, it was confirmed that the sharpness of the resist patterns was higher than the latter and the lines of the patterns were more distinct.

Solder plating was applied to the exposed copper portions of the resist patterns in a borofluoride bath having the following composition:

| | |
|---|---|
| Tin borofluoride (Sn(BF$_4$)$_2$) aqueous 45 wt.% solution | 300 g |
| Lead borofluoride (Pb(BF$_4$)$_2$) aqeuous 45 wt.% solution | 100 g |
| Borofluoric acid HBF$_4$ aqueous 42 wt.% solution | 220 g |
| Boric acid H$_3$BO$_3$ | 28 g |
| Water to make | 1 liter |

The electrolytic plating was performed for 30 minutes at a bath temperature of 30° C. and a current density (cathode) of 3.0 amp/dm$^2$ using a silver rod (weight ratio of tin to lead was 6:4) as the anode, whereby good plating was obtained. In this case, neither stripping of the resist patterns nor the formation of pin holes occured.

EXAMPLE 5

A photopolymerization solution having the following composition was prepared.

| | |
|---|---|
| Polymethyl methacrylate (Sumipex- | |

| | |
|---|---|
| BLG, made by Sumitomo Chemical Industries Co., Ltd.; molecular weight of about 30,000) | 45 g |
| Chlorinated polyethylene (Superchlon CPS-907 LTA; same as in Example 1) | 15 g |
| Diglycerol trimethacrylate | 90 g |
| 2-Benzoylmethylene-3-methyl-β-naphthothiazoline | 3 g |
| p-Methoxyphenol | 0.9 g |
| Pentaerithritol ester of partially hydrogenated rosin (Ester Gum-HP, made by Arakawa Rinsan Kagaku Kogyo K.K.; degree of hydrogenation: about 70% (defining complete double bond hydrogenation as 100% hydrogenation) | 3 g |

The coating composition thus prepared was coated on a polyethylene terephthalate film about 25 μm thick and dried for 10 minutes at 80° C. The dry thickness of the photopolymerizable composition was 30 μm. The photopolymerizable layer thus formed was superposed under pressure (about 1 kg/10 cm) on a copper base plate for making printed circuits at 25° C. Then, resist patterns for electroplating were formed on the copper plate by exposing the layer for 20 seconds using a positive transparency as in Example 4. Then, tin plating was applied to the exposed copper portions in the same manner as in Example 4, but, in this case, the resist patterns adhered strongly to the copper base plate in the plating bath and no stripping phenomenon was observed. In addition, a photopolymerizable composition solution having the same composition as above, except that the pentaerythritol ester of partially hydrogenated rosin (Ester Gum-HP) was not used, and a photoresist material was prepared using the photopolymerizable composition. When resist patterns were formed in the same way as above, such required an exposure time of 40 seconds. That is, this comparison experiment showed that the sensitivity of the photopolymerizable composition increased twice by incorporating therein the pentaerythritol ester of partially hydrogenated rosin.

EXAMPLE 6

A photoresist material was prepared by the same manner as in Example 1, and, when the layer of the photopolymerizable composition was dried, the photopolymerizable layer was immediately laminated onto a low density polyethylene film 25 μm thick, which was not surface treated and had a smooth surface, as a protective film to provide a photoresist material having a protective film. The laminate film was stored in the dark for 3 months at a temperature range of from 18° C. to 25° C. and a relative humidity range of from 45% to 70%. Thereafter, the protective film was separated and the layer of the photopolymerizable composition was superposed under pressure on a copper base plate as in Example 1. Then, by following the same procedure as in Example 1, resist patterns were formed on the copper base plate. The result was almost the same as in Example 1.

EXAMPLE 7

A photoresist material was prepared as in Example 3, and when the layer of the photopolymerizable composition dried, the layer of the photopolymerizable composition thus formed was immediately laminated onto a cellulose triacetate film 38 μm thick, which was not surface treated and had a smooth surface, as a protective film to provide a photoresist material having a protective film. The laminate film was stored for 6 months in the dark at the same temperature and relative humidity as in Example 6. Thereafter, the protective film was separated and the layer of the photopolymerizable composition was superposed under pressure on a copper base plate as in Example 1. Thereafter, resist patterns were formed in the same manner as in Example 3. The result obtained was almost same as in Example 3.

While the invention has been described in detail and with reference to specific embodiments thereof, it will be apparent to one skilled in the art that various changes and modifications can be made therein without departing from the spirit and scope thereof.

What is claimed is:

1. A stripping development type photoresist material comprising a support having coated thereon a layer of a photopolymerizable composition containing at least one chlorinated polyolefin film forming polymer, at least one monomer having at least one additional polymerizable unsaturated bond and at least one photopolymerization initiator, and a base material on the other side of said photopolymerizable composition layer, wherein the improvement comprises said photopolymerizable composition further containing a rosin tackifier in an amount sufficient to improve strength and uniformity of adhesion of resist patterns of the photopolymerizable composition to said base material after exposure.

2. The photoresist material of claim 1 wherein said rosin tackifier is gum rosin, wood rosin, or tall oil rosin.

3. The photoresist material of claim 1 wherein said rosin tackifier is polymerized rosin, partially hydrogenated rosin, a pentaerythritol ester of partially hydrogenated rosin, glycerol ester rosin, pentaerithritol ester rosin, monoethylene glycol ester rosin, methyl abietate, hydrogenated methyl abietate, diethylene glycol abietate, or diethylene glycol 2-hydroabietates.

4. The photoresist material of claim 1 wherein the amount of said rosin tackifier is about 0.1 to about 30% by weight of the total solids content of the photopolymerizable composition.

5. The photoresist material of claim 1 wherein said monomer having at least one addition polymerizable unsaturated bond is an acrylic acid ester, or a methacrylic acid ester.

6. The photoresist material of claim 1 wherein said monomer has two or more addition polymerizable unsaturated bonds.

7. The photoresist material of claim 6 wherein said monomer is ethylene glycol diacrylate, diethylene glycol methacrylate, polyethylene glycol diacrylate, pentaerithritol triacrylate, pentaerythritol dimethacrylate, dipentaerythritol pentacrylate, glycerol triacrylate, diglycerol dimethacrylate, 1,3-propanediol diacrylate, or a triacrylic acid ester of an ethyleneoxide-trimethylolpropane addition product.

8. The photoresist material of claim 1 wherein the chlorine content of said chlorinated polyolefin is no more than 75% by weight.

9. The photoresist material of claim 1 wherein said film forming polymer is selected from the group consisting of chlorinated polyethylene and chlorinated polypropylene.

10. The photoresist material of claim 1 wherein said film forming polymer is selected from the group consisting of chlorinated polyethylene and chlorinated polypropylene having a molecular weight of from about 8,000 to about 50,000 and exhibiting a degree of chlorination of 35 to 75% by weight.

11. The stripping development type photoresist material of claim 1, wherein said base material is a plate or film having a surface of a metal.

12. The stripping development type photoresist material of claim 1, wherein said base material is a copper base plate for a printed circuit or a flexible copper laminate.

13. The stripping development type photoresist material of claim 1, wherein said support is a polyethylene terephthalate film.

* * * * *